(12) United States Patent
Keays et al.

(10) Patent No.: US 7,774,683 B2
(45) Date of Patent: Aug. 10, 2010

(54) ERASURE POINTER ERROR CORRECTION

(75) Inventors: Brady L. Keays, Half Moon Bay, CA (US); Shuba Swaminathan, Los Gatos, CA (US); William H. Radke, San Francisco, CA (US)

(73) Assignee: Micron Technology, Inc., Boise, ID (US)

( * ) Notice: Subject to any disclaimer, the term of this patent is extended or adjusted under 35 U.S.C. 154(b) by 306 days.

(21) Appl. No.: 11/948,174

(22) Filed: Nov. 30, 2007

(65) Prior Publication Data

US 2008/0092017 A1    Apr. 17, 2008

Related U.S. Application Data

(63) Continuation of application No. 10/854,445, filed on May 26, 2004, now Pat. No. 7,322,002.

(51) Int. Cl.
*G11C 29/00* (2006.01)
(52) U.S. Cl. .................... 714/765; 711/162
(58) Field of Classification Search ................. 714/765, 714/763, 773, 769–771; 711/162
See application file for complete search history.

(56) References Cited

U.S. PATENT DOCUMENTS

| | | | |
|---|---|---|---|
| 5,754,567 A | 5/1998 | Norman | |
| 5,771,346 A | 6/1998 | Norman | |
| 5,787,484 A | 7/1998 | Norman | |
| 5,815,458 A | 9/1998 | Chevallier | |
| 5,864,569 A | 1/1999 | Roohparvar | |
| 5,873,112 A | 2/1999 | Norman | |
| 6,034,891 A | 3/2000 | Norman | |
| 6,047,352 A | 4/2000 | Lakhani | |
| 6,073,208 A | 6/2000 | Norman | |
| 6,601,211 B1 | 7/2003 | Norman | |
| 6,657,803 B1 * | 12/2003 | Ling et al. | .................... 360/53 |
| 2003/0041210 A1 | 2/2003 | Keays | |

* cited by examiner

*Primary Examiner*—Guy J Lamarre
(74) *Attorney, Agent, or Firm*—Leffert Jay & Polglaze, P.A.

(57) ABSTRACT

Improved memory devices, circuitry, and data methods are described that facilitate the detection and correction of data in memory systems or devices in combination with a stored record of known flaws, errors, or questionable data bits of a read memory row or block to allow for more efficient processing and correction of these errors. An embodiment of the present invention utilizes an erasure pointer that can store the location of N bad or questionable bits in the memory segment that is currently being read, where for each bit stored by the erasure pointer the embodiment also contains $2^N$ ECC generators to allow the read data to be quickly checked with the known bad bits in each possible state. This allows the read data to then be easily corrected on the fly before it is transferred by selecting the bad bit state indicated by the ECC generator detecting an uncorrupted read.

25 Claims, 6 Drawing Sheets

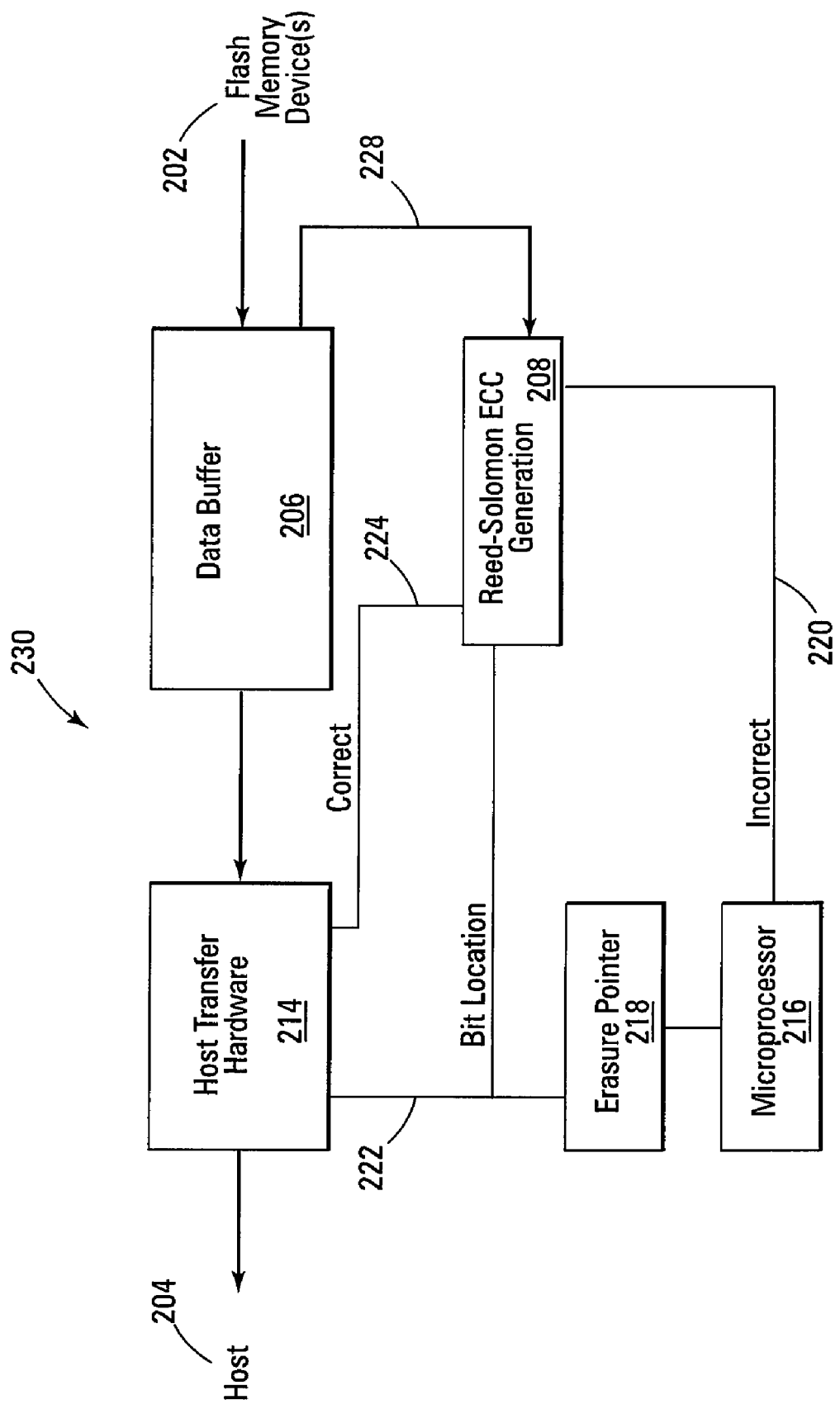

ERASURE POINTER ERROR CORRECTION

RELATED APPLICATION

This application is a Continuation of U.S. application Ser. No. 10/854,445 titled "ERASURE POINTER ERROR CORRECTION," filed May 26, 2004 (now U.S. Pat. No. 7,322,002, issued Jan. 22, 2008), which is commonly assigned and incorporated herein by reference.

TECHNICAL FIELD OF THE INVENTION

The present invention relates generally to integrated circuits and in particular the present invention relates to data error correction codes of memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to read-only memory (ROM), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively. Other types of non-volatile memory include, but are not limited to, Polymer Memory, Ferroelectric Random Access Memory (FeRAM), Ovionics Unified Memory (OUM), Nitride Read Only Memory (NROM), and Magnetoresistive Random Access Memory (MRAM).

Yet another type of non-volatile memory is a Flash memory. A Flash memory is a type of EEPROM that is typically erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks." The memory cells of a Flash memory array are typically arranged into a "NOR" architecture (each cell directly coupled to a bit line) or a "NAND" architecture (cells coupled into "strings" of cells, such that each cell is coupled indirectly to a bit line and requires activating the other cells of the string for access). Each of the cells within an erase block can be electrically programmed in a random basis by charging the floating gate. The charge can be removed from the floating gate by a block erase operation, wherein all floating gate memory cells in the erase block are erased in a single operation.

Each erase block of a Flash memory device typically contains user data areas and overhead data areas. The overhead data areas contain overhead information for operation of the erase block and/or the user data area the overhead data space is associated with. Such overhead information typically includes, but is not limited to, erase block management (EBM) data, sector status information, or an error correction code (ECC). In some Flash memory devices each erase block is divided into a series of logical sectors, where the logical sectors each generally contain 512 bytes of user data space and an associated control or overhead area. One or more of the logical sectors are each typically written to a single row of the Flash memory array (also known as a physical page) within the erase block.

In memory and memory systems, ECC's allow errors in the data stored in the memory to be detected and in many cases corrected. ECC codes include block codes, that are associated with a block of stored data (such as a memory data segment, a memory data block, or a memory data sector), and stream codes, that are typically utilized with streams of transmitted data. ECC codes include, but are not limited to, Hamming codes, Reed-Solomon (R-S) codes, Bose-Chaudhuri-Hochquenghem (BCH) codes, circular redundancy check codes (CRC-32), Golay codes, Reed-Muller codes, Goppa codes, and Denniston codes. In most memories and memory systems, error detection is accomplished via a dedicated ECC check hardware (referred to herein as ECC generators or ECC generator/checkers) as the data is read out. Unlike error detection, error correction is typically a more difficult process and generally involves a time consuming algorithmic process. As a result, error correction of data that has been detected as corrupt is generally done by a microprocessor or specialized hardware.

The prevalence of errors in modern memory devices, and in non-volatile and Flash memory devices in particular, have been tending to increase with smaller device sizes, increased array density, and lower operating voltages. In addition, increased active usage of non-volatile memory devices in electronic devices has tended to increase the incidence of operationally induced failures in these devices over long periods of active use due to due to physical damage, impurity migration, write fatigue, electrical transients, etc. This increased number of errors and the time consuming nature of using an ECC correction algorithm to correct errors combine in modern high speed memory devices to affect memory operation and speed; slowing the data rate of the memory device or memory system as these errors are corrected.

For the reasons stated above, and for other reasons stated below which will become apparent to those skilled in the art upon reading and understanding the present specification, there is a need in the art for improved ECC apparatus and methods that allows for fast and easy correction of data memories.

BRIEF DESCRIPTION OF THE DRAWINGS

FIGS. 2A, 2B, and 2C detail Flash memory controller outputs with ECC error check and correction circuits in accordance with embodiments of the present invention.

DETAILED DESCRIPTION OF THE INVENTION

Figure 1:
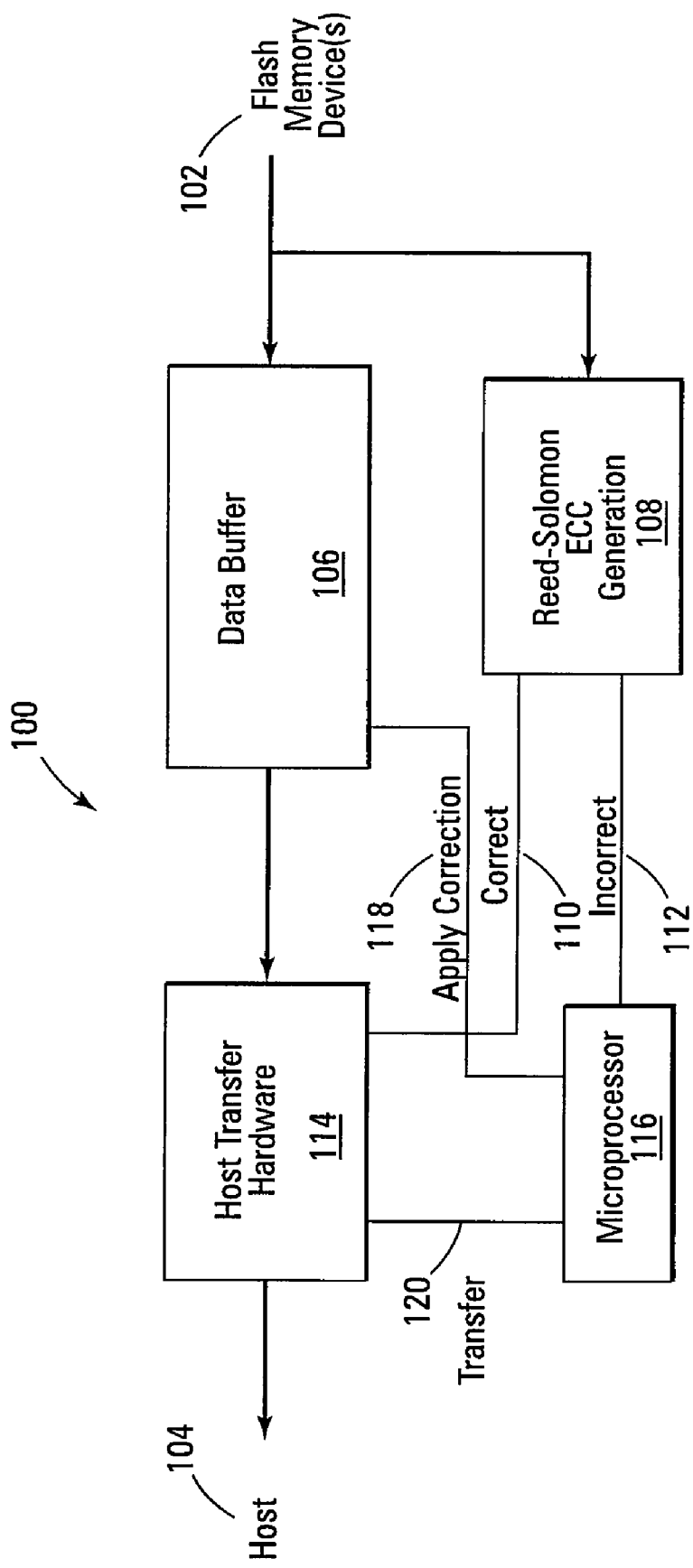
FIG. 1 details a prior art Flash memory controller output with ECC error check and correction circuits.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Memory devices, control circuitry, or data handling routines, in accordance with embodiments of the present invention, facilitate the detection and correction of data in memory systems or devices in combination with a stored record of known flaws, errors, or questionable data bits of a read memory row or block to allow for more efficient processing and correction of these errors. Memory embodiments of the present invention utilize specialized error detection and correction hardware and/or routines to efficiently detect and correct corrupted user data in a segment of memory, such as a sector, word line row, or erase block, using an erasure pointer that is loaded upon accessing data with one or more known bad or questionable data bits of the accessed memory segment. This speeds error correction and allows for an improved effective data rate for the memory system or device.

In one embodiment, a memory controller, memory system or memory device contains an erasure pointer that can store the location of N bad or questionable bits in the memory segment that is currently being read; where, for each bit stored by the erasure pointer the embodiment also contains $2^N$ ECC generators to allow the read data to be checked in a parallel manner with the known bad bits in each possible state. This allows the read data to then be easily corrected on the fly before it is transferred by selecting the bit state indicated by the ECC generator detecting an uncorrupted read and transferring the data from the memory with the bad bits in the indicated state. This allows for the data rate of the chip to be maintained by avoiding having to invoke a time consuming ECC data correction algorithm in a microprocessor or specialized hardware when the read data can be easily corrected by choosing a selected state of known bad bits. In another embodiment, the read data is iteratively circulated through an ECC generator while the status of the known bad or questionable bits are alternated in a selected manner to test if the read data can be easily corrected by choosing a selected state of known bad bits, before invoking the full ECC data correction algorithm. In yet another embodiment, the location of the known bad or questionable bits of a memory segment are read as an input value by a microprocessor or specialized hardware executing the ECC data correction algorithm to allow data error detection and correction to be extended. In further embodiment of the invention, the typical state of the known bad or questionable bits are recorded so that the iterative testing of read data with an ECC generator or the ECC data correction algorithm may be prioritized, so that a corrected read data result is reached more efficiently and in a shorter time period.

As stated above, modern memories are dealing with a greater incidence of errors in them. This is due to reductions in feature sizes, increased memory array/memory device densities, differing manufacturing processes, lower operating voltages, etc. In addition, in operating memory devices, electrostatic damage (ESD), write fatigue, electrical cross talk, and noise can also play a part in array damage or corruption of stored data. Therefore, the probability one or more bit errors in a given read memory segment or sector is higher, and, in particular, the incidence of single bit errors in a given memory segment are higher.

In modern NAND Flash memory, many of these errors will be due to string errors, which generally will occur when a string has or develops one or more bad memory cells that dominate the string such that the entire string reads bad. Since each individual bit of a NAND architecture Flash memory word line/row page typically are read from a single string, a bad string will cause a bad bit to occur across multiple word line rows and corrupt them (i.e., a bad NAND string that crosses 32 word line rows/pages, causing a single bit error on each). Another type of single bit error also possible in modern memory devices are global bit line errors, where the global metal line that a local bit line or NAND string is connected to couple the read data bit out of the memory array is damaged, causing a single bit error across the whole memory array space.

Memory manufacturers and memory management software/hardware typically try to fix these errors in memory devices by utilizing redundant memory elements (redundant word line rows, local and global bit line columns, erase blocks, etc.) specifically included in the memory for this purpose or by writing off the damaged areas as unusable and marking the affected sections, erase blocks, or word line rows as bad. However, these redundant elements are expensive to include and take away from the space available for the memory array, therefore there are limits to what can be fixed in a given memory device by such methods, particularly given the density of current memory devices.

As a result of the increased incidence of errors, memory controllers and embedded ECC systems currently are being asked to deal with an increased number of situations where error correction is required. However, the computation in these systems that is required if a bit error is detected in read data by common ECC block codes is significant. As a result, the data rate of the memory system or device can drop appreciably as the incidence of errors increases.

As stated above, memories typically utilize ECC codes to detect errors in read data. ECC codes also allow for correction of a limited number of these errors. ECC codes, and block ECC codes in particular, are commonly based on specialized polynomial equations, where the stored ECC codes are the generated coefficients of the polynomial for the current data. When the data is read out of a memory the data integrity is checked by regenerating these coefficients from the read data; serially running the read data through a hardware ECC generator/checker to regenerate the ECC code, and comparing them against the coefficients in the stored ECC code. If the generated and stored ECC codes do not match an error has been detected.

Once an error in read data is detected, the transfer of the data out of the memory device or system is halted and ECC correction algorithm is started. The ECC correction algorithm, generally speaking, solves for the zeros of the polynomial to locate the data word(s) and bit(s) within the data words that need to be corrected. In doing this, two separate pieces of information (ECC codes) are typically required to allow the ECC algorithm to solve for each single bit error, allowing the algorithm to solve for a byte location and a bit location bitmask to XOR to correct the corrupted bit. Thus for each 2 ECC block codes the ECC block code algorithms are typically able to correct a single bit error in a segment of read data.

Reed-Solomon error correction block codes are one of a number of block codes commonly utilized in memory device applications. As stated above, with a block code generator, a block of data is fed into the block code generator to generate the ECC code to be stored associated with the data block in the memory device. In implementation in embodiments of the present invention, a Reed-Solomon code generator is fed a data block (a data sector) of 512 bytes and generates six 10-bit symbols that form the ECC code to tag on to the end of the data block. From these six symbols of the ECC code it is possible to detect errors in the data block as it is read from the memory device, and, in one embodiment of the present invention, correct for 2 randomly corrupted single data bits or 2 "bit-pairs" (bit-pair's are the adjacent bits of a data byte grouped as 76 54 32 10, where 7 to 0 are the bit positions in the byte).

ECC code generators typically serialize the data block into a data stream to generate the ECC code. A similar process is also generally utilized to check a read data block by regenerating the ECC code from the read data block and evaluating it against the stored associated ECC code. In generating an ECC code, a Reed-Solomon code generator typically assumes a data block filled with 10-bit data symbols. Thus, to work with the standard 8-bit byte used for data symbols in most computer systems each byte is padded with two leading 0's internal to the code generator. In checking data block and its associated ECC code, the ECC code generator/code check hardware produces a stream of binary digits in what is know as a Linear Feedback Shift Register (LFSR) code. If the stream of binary digits is all zeros, no errors have been detected in the read data block. If one or more non-zero bits are output, there is an error and further processing is required by the ECC correction algorithm to try to determine the location of the error(s) and correct them. In determining the location of the errors, the Reed-Solomon ECC algorithm utilizes six stored 10-bit symbols of the ECC code and solves for the zeros of the polynomial to locate the symbol(s) in the data block that are corrupted and the bit(s) within that symbol that are incorrect.

A memory embodiment of the present invention utilizes specialized ECC hardware and/or routines to detect and correct errors in data segments or blocks. This ECC circuitry and method facilitates the use of known bad or questionable data bits in the data block or segment being read in generating an ECC correction, allowing for an increased efficiency ECC correction algorithm and/or fast correction of the read data by utilizing only the ECC code generator/data checker. In one embodiment of the present invention, multiple ECC code generators/data checkers check the known bad/questionable bits of the block in differing states for a given read data block. In this embodiment, the ECC code generator/data checker that evaluates an un-corrupted data block, and corresponds to the correct state of the bad/questionable bits, selects the version of the data block that is transferred from the memory system or memory device. In another embodiment, differing versions of the read data block with the known bad/questionable bits of the block in incrementally differing states are iteratively checked by a single ECC code generator/data checker, the state of the bad/questionable bits that evaluates to an un-corrupted data block selects the version of the data block that is transferred from the memory system or memory device. If none of the possible states for the known bad/questionable bits lead to a data block that evaluates as un-corrupted, the ECC checking algorithm is invoked as normal to try to correct the data of the read data block.

In yet another embodiment, the typical or likely "stuck at" state of the bad/questionable bits for a given data block or segment are stored and utilized to prioritize the operation of an iteratively checking ECC code generator/data checker by selecting the data state of the bad/questionable bits to check first. In a further embodiment, the location and/or likely state of the known bad/questionable bit(s) are utilized as input to the ECC correction algorithm/hardware for use in prioritizing solving for the corrected state of the data block (e.g., solutions including the known bad/questionable bits in their non-stuck at states can be tried first).

In a further embodiment, the location of the known bad/questionable bits are utilized as input to the ECC algorithm to extend it and allow it to correct more corrupted bits by substituting the locations of the known bad/questionable bits as possible partial solutions and utilizing the ECC symbols in the ECC correction algorithm to solve for the remaining corrupted bits.

In embodiments of the present invention, since a portion of the errors encountered in the data blocks of a memory array are static, if the location of the errors are known and/or their likely state is known, an attempt can be made to correct these static errors using this knowledge. In addition, these correction attempts can be quickly accomplished before invoking the time consuming error correction algorithm in either hardware or software. Aiding in these attempts are the fact that single bit errors are more likely than multi-bit errors, generally leading to a limited number of alternative known bad/questionable bit possibilities to check for a correct solution. This allows for embodiments of the present invention to attempt an initial quick error correction by running multiple versions of the currently read data block through ECC generator/checker hardware in either a parallel fashion, utilizing multiple ECC generator/checkers, or in an iterative fashion through a single ECC generator/checker. In utilizing multiple ECC generator/checkers to evaluate multiple differing states of the known bad/questionable bit(s), more than one ECC generator/checker is operated in parallel to attempt to locate a correction for the read data in the same time as error detection would normally take. In one embodiment of the present invention, in evaluating the multiple differing states of the known bad/questionable bit(s), the number of ECC generator/checkers operating in parallel increases on the order of $2^N$, where N is the maximum number of known bad/questionable bits to attempt to correct for.

Embodiments of the present invention also utilize the location and/or state of the static known bad/questionable bits as inputs to the error correction process to extend the correction algorithm to allow more errors to be solved for and corrected for a given number of ECC block codes. Embodiments of the present invention also utilize the likely state of the known bad/questionable bit(s) to prioritize an iterative error checking attempt, to check versions of the read data block with the known bad/questionable bits in the states with a higher probability of generating a correction. In other embodiments of the present invention, the likely state of the known bad/questionable bit(s) is utilized to prioritize the error correction algorithm so that versions of the read data block with the known bad/questionable bits in the states that have a higher probability of generating a correction are checked first.

FIG. 1 shows a simplified diagram of a memory controller output 100 of the prior art coupled through a memory interface 102 to one or more Flash memory devices and through a host interface 104 to an external host (not shown), which typically is a processor or computer system. In the memory controller 100, a data buffer 106 is coupled to serially receive and hold a selected data block that is serially read through the memory interface 102 from a selected Flash memory device before it is transferred from the data buffer 106 through the host interface 104 under control of the host transfer hardware 114. The serially streamed data block is also coupled to a Reed-Solomon ECC generator/checker hardware 108, which regenerates the ECC codes from the data block and checks them against the stored ECC codes attached at the end of the data block stream. Once the data block is read and evaluated, the Reed-Solomon ECC generator/checker hardware 108 signals 110 to the host transfer hardware 114 to start the data transfer if the data block is correct (the data block ECC codes have been generated and evaluated correctly against the stored ECC codes for the data block, typically generating a string of zeros from the Reed-Solomon ECC generation hardware 108). If the data block is corrupted (the generated data block ECC codes have evaluated incorrectly against the stored ECC codes for the data block, typically generating a non-zero value in string of zeros output from the Reed-Solomon ECC generation hardware 108) the Reed-Solomon ECC generator/checker hardware 108 signals 112 a (typically internal) microprocessor or dedicated ECC correction hardware 116 to correct the errors by utilizing a Reed-Solomon ECC correction algorithm. The microprocessor 116 solves the Reed-Solomon polynomial to determine the bits to be corrected in the data block and applies the correction 118 to the data block contents held in the data buffer 106. After applying the correction to the data buffer 106, the microprocessor 116 signals 120 the host transfer hardware 114 to begin transferring the data block from the data buffer 106 out through the host interface 104.

Figure 2A:
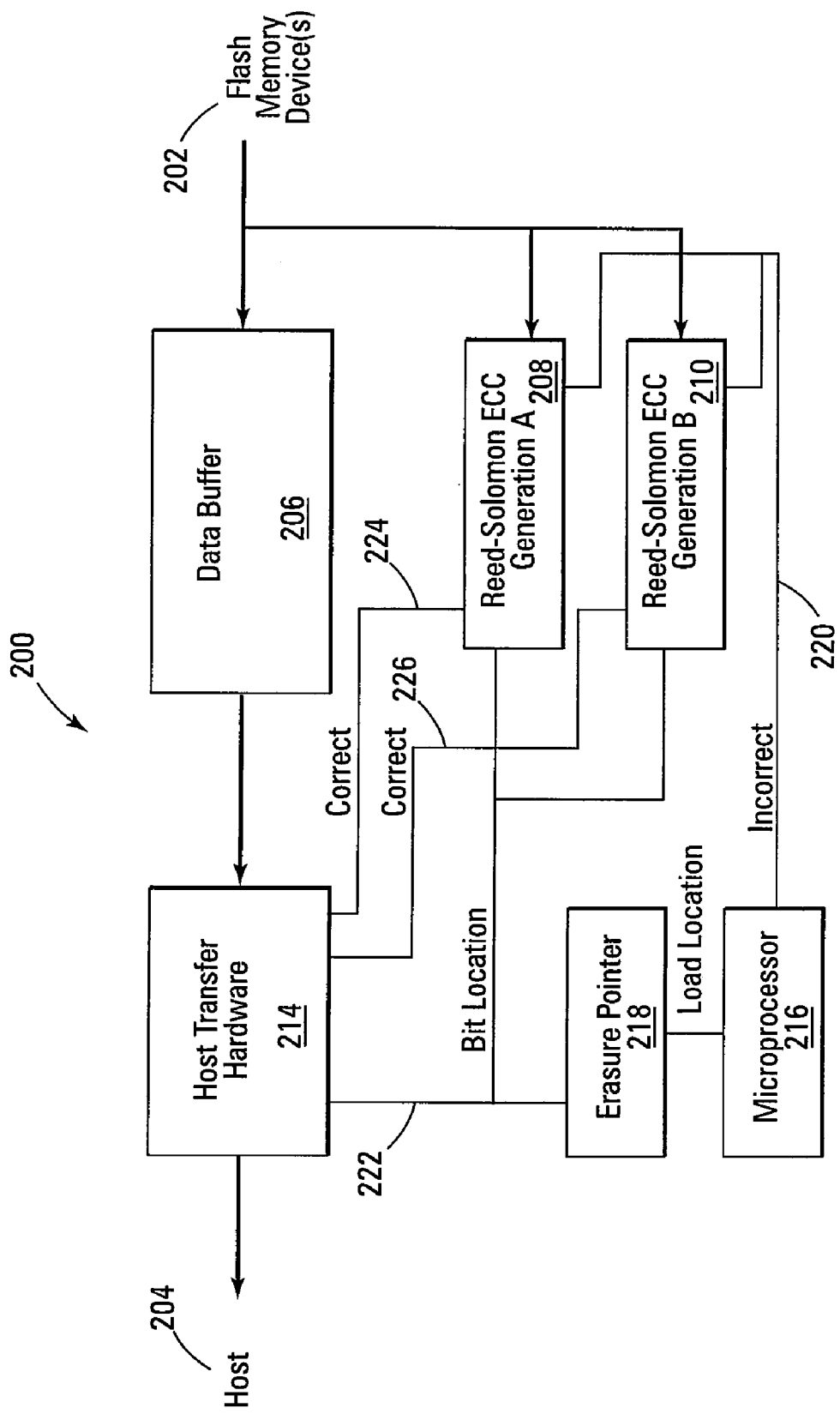

FIG. 2A shows a simplified diagram of a memory controller 200 of an embodiment of the present invention that can correct for a known bad/questionable bit in a data block/segment. In FIG. 2A, the memory controller 200 is coupled through a memory interface 202 to one or more Flash memory devices and through a host interface 204 to an external host (not shown). A data buffer 206 is coupled to serially receive and hold a selected data block that is read through the memory interface 202 from a selected Flash memory device before it is transferred from the data buffer 206 through the host interface 204 under control of the host transfer hardware 214. In addition, the serially streamed data block is coupled to two Reed-Solomon ECC generators/checkers 208, 210, which separately regenerate the ECC codes from the data block with the known bad bit set in a differing state (the known bad bit set as read in ECC generator/checker 208 and inverted in ECC generator/checker 210). The location 222 of the known bad/questionable bit is coupled to the ECC generators/checkers 208, 210 from an erasure pointer register 218. The erasure pointer 218 is loaded upon each read access by the microprocessor 216, from a record of known bad/questionable bits, with the known bad/questionable bit, if any, for the memory sector/segment that is being read.

Each ECC generator/checker 208, 210 compares its regenerated ECC code against the stored ECC codes attached at the end of the data block stream. Once the data block is read and evaluated, the Reed-Solomon ECC generator/checker hardware 208, 210 that evaluated correctly signals 224, 226 which version, if any, of the read data sector/segment and state of the known bad/questionable bit is correct.

The bit location 222 and the correct signals 224, 226 from the ECC generators/checkers 208, 210 are coupled to the host transfer hardware 214. The host transfer hardware 214 starts the data transfer upon receiving an active correct signal 224, 226 and corrects the known bad/questionable bit as necessary as it is transferred out of the memory controller 200 from the data buffer 206.

If the data block is corrupted (both of the generated data block ECC codes having evaluated incorrectly against the stored ECC codes for the data sector) the microprocessor 216 is signaled to attempt to correct the errors by utilizing a Reed-Solomon ECC correction algorithm. The microprocessor 216 solves the Reed-Solomon polynomial to determine the bits to be corrected in the data sector and applies the correction to the data sector contents held in the data buffer 206. After applying the correction to the data buffer 206, the microprocessor 216 signals the host transfer hardware 214 to begin transferring the data sector from the data buffer 206 out through the host interface 204.

It is noted that in an alternative embodiment of the present invention, the bit location 222 and the ECC generators/checkers 208, 210 correct signals 224, 226 are coupled to the data buffer 206. In this embodiment, the read data is corrected, if necessary, in the data buffer 206 before it is transferred out of the memory controller 200 by the host transfer hardware 214.

More ECC generators/checkers 208, 210 can be added to the memory controller 200 to increase the number of bad/questionable bits that can be corrected for automatically by the memory controller 200. In so doing, the ECC generators/checkers 208, 210 are increased by $2^N$, where N is the maximum number of bad bits to be corrected for by the memory controller 200 for each memory sector/segment. For example, automatically correcting for a maximum of 2 known bad/questionable bits would require 4 ECC generators/checkers 208, 210, correcting for 3 known bad bits would require 8 ECC generators/checkers 208, 210, etc.

It is noted that although the memory controller 200 is designed to be externally coupled to one or more Flash memory devices that memory outputs that are internal to a memory device incorporating embodiments of the present invention should be apparent to those skilled in the art with the benefit of the present disclosure.

FIG. 2B shows a simplified diagram of a memory controller 230 of an embodiment of the present invention that iteratively tests and corrects for known bad/questionable bit(s) in a data block/segment. In FIG. 2B, the memory controller 230 is coupled through a memory interface 202 to one or more Flash memory devices and through a host interface 204 to an external host (not shown). A data buffer 206 is coupled to receive and hold a selected data block that is read through the memory interface 202 from a selected Flash memory device before it is transferred from the data buffer 206 through the host interface 204 under control of the host transfer hardware 214.

The read data block is iteratively cycled from the data buffer 206 through a coupled Reed-Solomon ECC generator/checker 208, which regenerates the ECC codes from the data block with the known bad bit(s) set in a state selected by the location 222 of the known bad/questionable bit(s) that is coupled to the ECC generator/checker 208 from an erasure pointer register 218. The erasure pointer 218 is loaded by the microprocessor 216, from a record of known bad/questionable bits, with the known bad/questionable bit, if any, for the memory sector/segment that is being read. The microprocessor 216 selects the state of the bad/questionable bit(s) to be checked by the ECC generator/checker 208 on each iteration cycle of the read data from the data buffer 206. On each iteration, the ECC generator/checker 208 compares its regenerated ECC code against the stored ECC codes attached at the end of the data block stream and signals if the selected state of the data is correct 224 or incorrect 220 for the current iteration. Once the ECC generator/checker 208 evaluates a correct read data block/sector it signals 224 that a correct version has been evaluated, indicating the state of the known bad/questionable bit(s) that is correct.

The state and location 222 of the bit(s) are coupled to the host transfer hardware 214. The host transfer hardware 214 starts the data transfer upon receiving an active correct signal 224 from the ECC generator/checker 208 and corrects the known bad/questionable bit(s) as necessary as data is transferred out of the memory controller 230 from the data buffer 206.

If the data block is corrupted (none of the iteratively generated data block ECC codes having evaluated incorrectly against the stored ECC codes for the data sector) the microprocessor 216 attempts to correct the errors by utilizing a Reed-Solomon ECC correction algorithm. The microprocessor 216 solves the Reed-Solomon polynomial to determine the bits to be corrected in the data sector. After applying the correction to the data buffer 206, the microprocessor 216 signals the host transfer hardware 214 to begin transferring the data sector from the data buffer 206 out through the host interface 204.

It is noted that the bit location 222 and the ECC generator/checker 208 correct signal 224 can be coupled to the data buffer 206. In this embodiment, the read data is corrected, if necessary, in the data buffer 206 before it is transferred out of the memory controller 230 by the host transfer hardware 214. It is also noted that the control of the current state of the known bad/questionable bit(s) during iterative checking can be under the control of a hardware controller and not the microprocessor 216. It is further noted that the likely state of the known bad/questionable bit(s) can be recorded and utilized to prioritize the iterative checking by the ECC generator/checker 208.

Figure 2C:
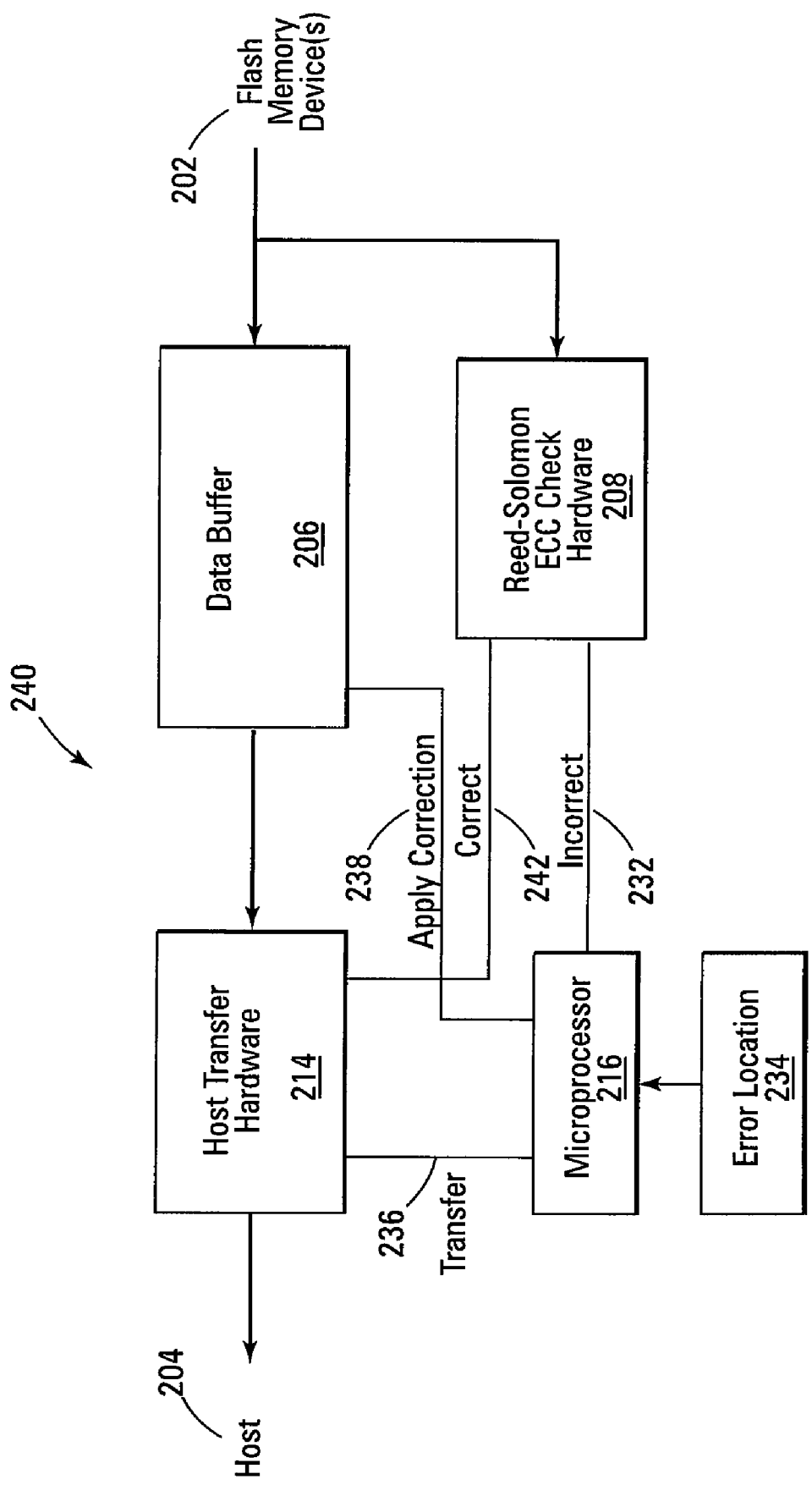

FIG. 2C shows a simplified diagram of a memory controller 240 of an embodiment of the present invention that prioritizes correcting for errors in a read data block/segment by recording the location and state of known bad/questionable bit(s) for use in prioritizing the ECC correction algorithm. In FIG. 2C, the memory controller 240 is coupled through a memory interface 202 to one or more Flash memory devices and through a host interface 204 to an external host (not shown). A data buffer 206 is coupled to receive and hold a selected data block that is read through the memory interface 202 from a selected Flash memory device before it is transferred from the data buffer 206 through the host interface 204 under control of the host transfer hardware 214.

The read data block is coupled to the data buffer 206 and to a Reed-Solomon ECC generator/checker 208, which regenerates the ECC codes from the data block. Once the data block is read and evaluated, the Reed-Solomon ECC generator/checker 208 signals 242 to the host transfer hardware 214 to start the data transfer if the data block is correct. If the data block is corrupted, the Reed-Solomon ECC generator/checker 208 signals 232 a microprocessor or dedicated ECC correction hardware 216 to correct the errors by utilizing a Reed-Solomon ECC correction algorithm.

The microprocessor 216 solves the Reed-Solomon polynomial to determine the bits to be corrected in the data block and applies the correction 238 to the data block contents held in the data buffer 206. After applying the correction to the data buffer 206, the microprocessor 216 signals 236 the host transfer hardware 214 to begin transferring the data block from the data buffer 106 out through the host interface 204.

In solving the Reed-Solomon polynomial to determine the bits to be corrected in the data block/sector, the microprocessor 216 prioritizes its method utilizing the known bad/questionable bit(s) and/or their likely state. The information on the known bad/questionable bit(s) and/or their likely state read by the microprocessor 216 from a record 234 kept of known bad/questionable bit(s) for each data block/sector.

In alternative embodiment of the memory controller 240 of FIG. 2C, the location and/or likely state of the known bad/questionable bits are utilized as input to the ECC algorithm to extend it and allow it to correct more corrupted bits by substituting the locations and/or likely states of the known bad/questionable bits as possible partial solutions and utilizing the ECC symbols in the ECC correction algorithm to solve for the remaining corrupted bits.

It is noted that the embodiment of FIG. 2C can be combined with those of FIG. 2A or 2B to prioritize the error correction algorithm of their microprocessors 216. It is also noted that the read data can be corrected, if necessary, by the host transfer hardware 214 as it is transferred out of the memory controller 240.

It is noted that, although the memory controllers 200, 230, and 240 of FIGS. 2A, 2B, and 2C are designed to be externally coupled to one or more Flash memory devices, that memory controllers 200, 230, and 240 that are internal to a memory device incorporating embodiments of the present invention should be apparent to those skilled in the art with the benefit of the present disclosure.

Because all the cells in an erase block of a Flash memory device are generally erased all at once, one cannot directly rewrite a Flash memory cell without first engaging in a block erase operation. EBM, typically under the control of an internal state machine, an external Flash memory controller, or software driver, provides an abstraction layer for this to the host (a processor or an external memory controller), allowing the Flash device to appear as a freely rewriteable device, including, but not limited to, managing the logical address to physical erase block translation mapping for reads and writes, the assignment of erased and available erase blocks for utilization, and the scheduling erase blocks that have been used and closed out for block erasure. Erase block management also allows for load leveling of the internal floating gate memory cells to help prevent write fatigue failure. Write fatigue is where the floating gate memory cell, after repetitive writes and erasures, no longer properly erases and removes charge from the floating gate. Load leveling procedures increase the mean time between failure of the erase block and Flash memory device as a whole.

Many of the modern computer operating systems, such as "DOS" (Disk Operating System), were developed to support the physical characteristics of hard drive structures; supporting file structures based on heads, cylinders and sectors. The DOS software stores and retrieves data based on these physical attributes. Magnetic hard disk drives operate by storing polarities on magnetic material. This material is able to be rewritten quickly and as often as desired. These characteristics have allowed DOS to develop a file structure that stores files at a given location which is updated by a rewrite of that location as information is changed. Essentially all locations in DOS are viewed as fixed and do not change over the life of the disk drive being used therewith, and are easily updated by rewrites of the smallest supported block of this structure. A sector (of a magnetic disk drive) is the smallest unit of storage that the DOS operating system supports. In particular, a sector has come to mean 512 bytes of information for DOS and most other operating systems in existence. Flash memory systems that emulate the storage characteristics of hard disk drives are preferably structured to support storage in 512 byte blocks along with additional storage for overhead associated with mass storage, such as ECC bits, status flags for the sector or erase block, and/or redundant bits.

In many modern Flash memory device implementations, the host interface and erase block management routines additionally allow the Flash memory device to appear as a read/write mass storage device (i.e., a magnetic disk) to the host. One such approach is to conform the interface to the Flash memory to be identical to a standard interface for a conventional magnetic hard disk drive allowing the Flash memory device to appear as a block read/write mass storage device or disk. This approach has been codified by the Personal Computer Memory Card International Association (PCMCIA), Compact Flash (CF), and Multimedia Card (MMC) standardization committees, which have each promulgated a standard for supporting Flash memory systems or Flash memory "cards" with a hard disk drive protocol. A Flash memory device or Flash memory card (including one or more Flash memory array chips) whose interface meets these standards can be plugged into a host system having a standard DOS or compatible operating system with a Personal Computer Memory Card International Association-Advanced Technology Attachment (PCMCIA-ATA) or standard ATA interface. Other additional Flash memory based mass storage devices of differing low level formats and interfaces also exist, such as Universal Serial Bus (USB) Flash drives.

Figure 3A:
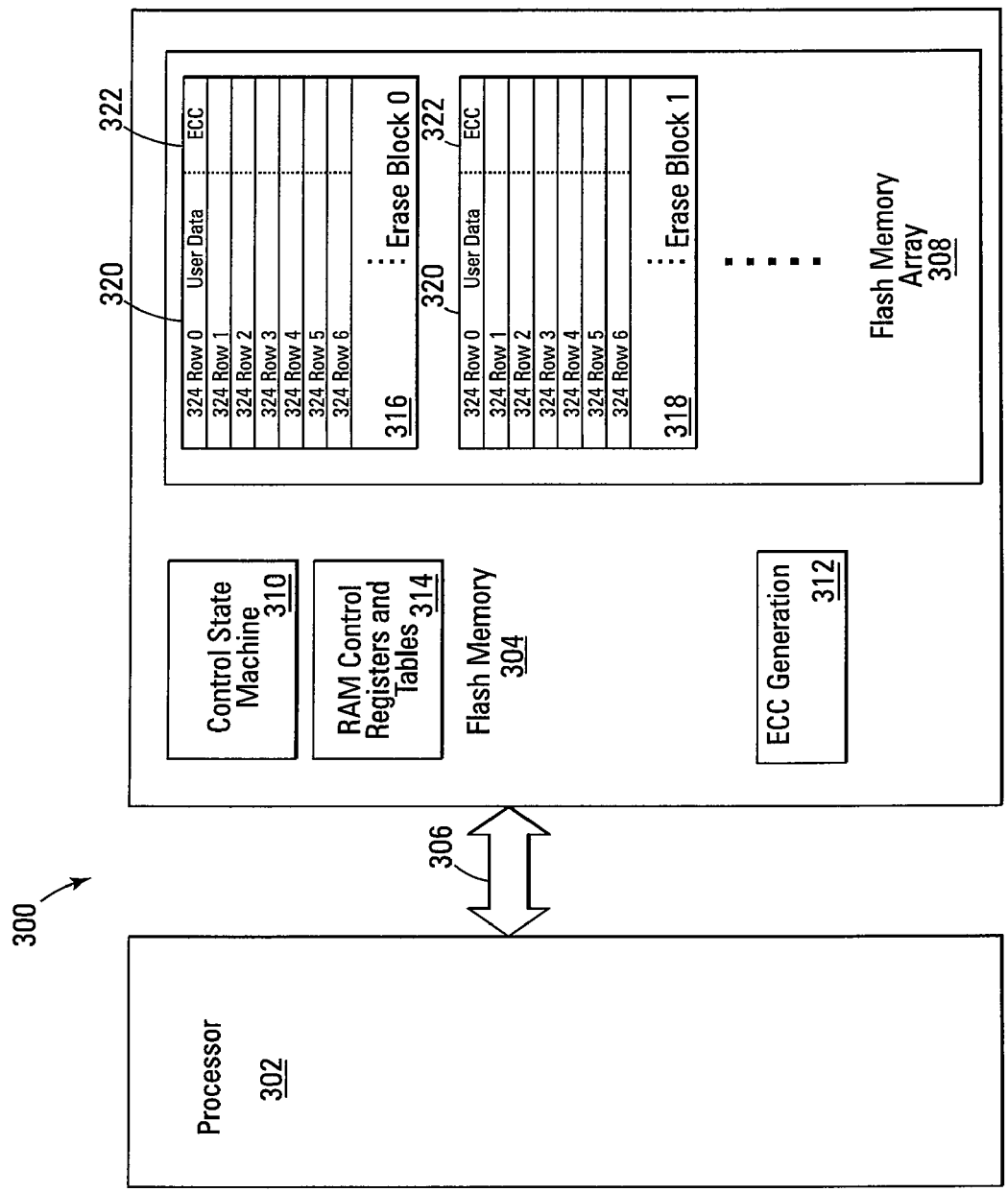
FIGS. 3A and 3B detail memory systems with memory and memory controllers in accordance with embodiments of the present invention.

FIG. 3A is a simplified diagram of a system 300 that incorporates a Flash memory device 304 embodiment of the present invention. In the system 300 of FIG. 3A, the Flash memory 304 is coupled to a processor 302 with an address/data bus 306. Internally to the Flash memory device, a control state machine 310 directs internal operation of the Flash memory device; managing the Flash memory array 308 and updating RAM control registers and tables 314. The Flash memory array 308 contains floating gate memory cells arranged in a sequence of erase blocks 316, 318. Each erase block 316, 318 contains a series of physical pages, each page containing one or more logical sectors 324 (shown here for illustration purposes as a single logical sector 324 per physical page/row) that contain a user data space 320 and a control/overhead data space 322. The overhead data space 322 contains overhead information for operation of the sector 320, such as an error correction code (not shown), status flags, or an erase block management data field area (not shown). The RAM control registers and tables 314 are loaded at power up from the non-volatile erase block management registers and tables (not shown) by the control state machine 310. The user data space 320 in each logical sector 324 is typically 512 bytes long. It is noted that other interfaces to the Flash memory 304 and formats for the erase blocks 316, 318, physical pages, and sectors 324 are possible and should be apparent to those skilled in the art with benefit of the present disclosure. In FIG. 3A, the Flash memory 304 contains ECC generation and checking hardware 312 incorporating embodiments of the present invention.

Figure 3B:
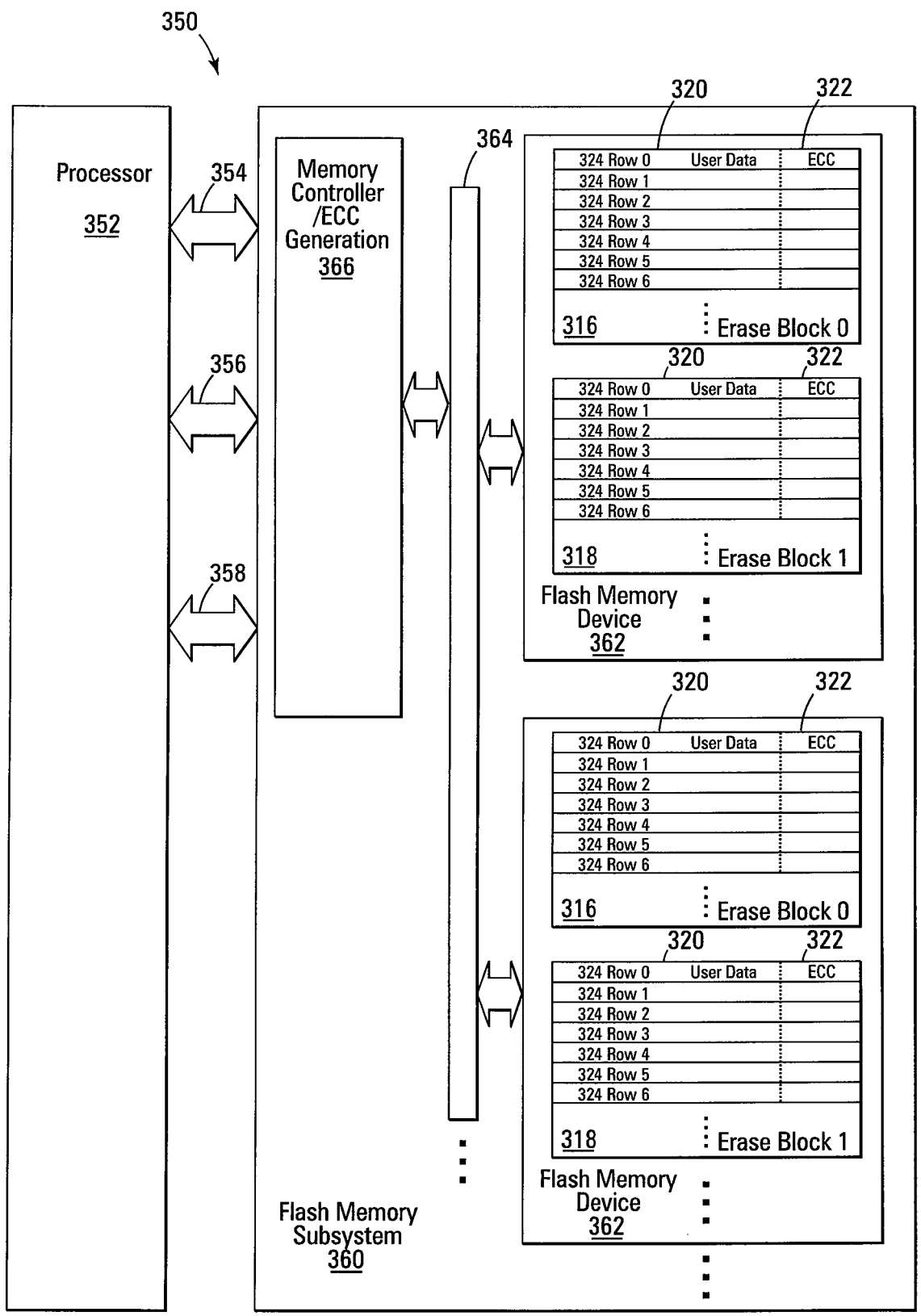

FIG. 3B is a simplified diagram of another system 350 that incorporates a Flash memory system 360 embodiment of the present invention. In the system 350 of FIG. 3B, the Flash memory system 360, such as a memory system or Flash memory card, is coupled to a processor 352 with an address 354, control 356, and data bus 358. Internal to the Flash memory system 360, a memory controller 366 directs internal operation of the Flash memory system 360; managing the Flash memory devices 362, directing data accesses, updating internal control registers and tables (not shown), and/or directing operation of other possible hardware systems (not shown) of the Flash memory system 360. The memory controller 366 has an internal ECC generation and checking hardware (not shown) that incorporates embodiments of the present invention. The memory controller 366 may optionally incorporate a small local embedded processor to help manage the Flash memory system 360. The memory controller 366 is coupled to and controls one or more Flash memory devices 362 via an internal control bus 364. It is noted that other architectures Flash memory systems 360, external interfaces 354, 356, 358, and manners of coupling the memory controller 366 to the Flash memory devices 362, such as directly coupled individual control busses and signal lines, are possible and should be apparent to those skilled in the art with benefit of the present disclosure.

The Flash memory devices 362 each contain a sequence of erase blocks 316, 318 in their internal memory arrays. Each erase block 316, 318 contains a series of physical pages, each physical page having one or more logical sectors 324 that contain a user data space 320 and a control/overhead data space 322 (shown here for illustration purposes as a single logical sector 324 per physical page/row). The overhead data space 322 contains an ECC code (not shown) and other overhead information for operation of the logical sector 320, such as status flags, or an erase block management data field area (not shown).

It is noted that the ECC checking and correction of Flash memory embodiments of the present invention can apply to other non-volatile memory types including, but not limited to, polymer memory, FeRAM, OUM, NROM, and MRAM and should be apparent to those skilled in the art with the benefit of the present invention.

It is also noted that other ECC checking and correction sequences, methods, and circuits in memory embodiments of the present invention are possible and should be apparent to those skilled in the art with benefit of the present disclosure.

CONCLUSION

Improved memory devices, circuitry, and data methods have been described that facilitate the detection and correction of data in memory systems or devices in combination with a stored record of known flaws, errors, or questionable data bits of a read memory row or block to allow for more efficient processing and correction of these errors. An embodiment of the present invention utilizes an erasure pointer that can store the location of N bad or questionable bits in the memory segment that is currently being read, where for each bit stored by the erasure pointer the embodiment also contains $2^N$ ECC generators to allow the read data to be quickly checked with the known bad bits in each possible state. This allows the read data to then be easily corrected on the fly before it is transferred by selecting the bad bit state indicated by the ECC generator detecting an uncorrupted read. This allows for the data rate of the chip to be maintained by avoiding having to invoke the time consuming ECC data correction algorithm in a microprocessor or specialized hardware if the read data can be easily corrected by choosing a selected state of known bad bits. In another embodiment, the read data is iteratively circulated through an ECC generator while the known bad or questionable bits are incremented to test if the read data can be easily corrected by choosing a selected state of known bad bits, before invoking the full ECC data correction algorithm. In yet another embodiment the location of the known bad or questionable bits of a memory segment are read by a microprocessor or specialized hardware executing the ECC data correction algorithm as input to allow data error detection and correction to be extended. In further embodiment of the invention, the typical state of the known bad or questionable bits are recorded so that the iterative testing of read data with an ECC generator or the ECC data correction algorithm may be prioritized, so that a corrected read data result is reached more efficiently and in a shorter time period.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory comprising:
    a memory array containing a plurality of memory cells arranged into a plurality of segments;
    a data buffer;
    a host transfer circuit coupled to the data buffer; and
    wherein the memory is adapted to read data and associated ECC codes from a selected segment of the memory array and read an associated erasure pointer record of known bad or questionable data positions in the selected segment; and
    wherein the memory is adapted to check the read data utilizing the associated ECC codes, where the read data is checked utilizing the associated ECC codes and one or more selected states of two or more possible states of the known bad or questionable data positions from the associated erasure pointer.

2. The memory of claim 1, wherein the memory is adapted to select the read data from the selected segment and a selected state of the two or more possible states of the known bad or questionable data positions in the selected segment for transfer from the memory, where the data and the state of known bad or questionable data positions evaluate in an ECC check as correct data utilizing the associated ECC codes.

3. The memory of claim 1, wherein the memory is adapted to initiate an ECC error correction algorithm if no state of the two or more possible states of the known bad or questionable data positions and the read data evaluate as correct.

4. The memory of claim 1, wherein the memory is further adapted to:
    record a probabilistically likely state of the known bad or questionable data positions stored in the erasure pointer; and
    prioritize checking the read data and the associated ECC for one or more possible states of the known bad or questionable data positions based on the probabilistically likely state of the known bad or questionable data positions.

5. The memory of claim 4, wherein the memory is further adapted to initiate an ECC error correction algorithm if no state of the known bad or questionable data positions and the read data evaluate as correct, where the ECC error correction algorithm is prioritized to evaluate solutions based on the probabilistically likely state of the known bad or questionable data positions and/or extends the number of corrupted data positions the ECC error correction algorithm can correct utilizing the location of the known bad or questionable data positions.

6. The memory of claim 1, wherein the memory is further adapted to check the read data utilizing the associated ECC codes in $2^N$ parallel ECC checks, where N is a number of known bad or questionable data positions stored in the associated erasure pointer, and where each of the $2^N$ parallel ECC checks evaluates the read data with the N known bad or questionable data positions in a differing state of the two or more possible states.

7. The memory of claim 1, wherein the memory is further adapted to check the read data utilizing the associated ECC codes by iteratively evaluating the read data and associated ECC codes in an ECC check, where each iteration of the ECC check evaluates the read data with the known bad or questionable data positions in a different state of the two or more possible states.

8. The memory of claim 1, wherein the memory is adapted to discover and record known bad or questionable data positions of a segment of the plurality of segments in an associated erasure pointer record.

9. A system, comprising:
    a host coupled to at least one memory device, wherein the memory device contains a memory array with a plurality of memory cells arranged in one or more data segments, where each data segment contains an ECC code;
    wherein the system is adapted to read data and the associated ECC code from a selected segment from the memory array of the memory device and read an associated erasure pointer of known bad or questionable data positions in the selected segment, and where the system is adapted to check the read data utilizing the associated ECC code and a selected data state of two or more possible data states of the known bad or questionable data positions.

10. The system of claim 9, wherein the system is adapted to select a state of the two or more possible states of the known bad or questionable data positions in the selected segment, where the read data and the selected state of known bad or questionable data positions evaluate as uncorrupted data utilizing the associated ECC code.

11. The system of claim 9, wherein the system is further adapted to check the read data utilizing the associated ECC code in $2^N$ parallel ECC checks, where N is a number of known bad or questionable data positions stored in the associated erasure pointer, and where each of the $2^N$ parallel ECC checks evaluates the read data with the N known bad or questionable data positions in a differing state of the two or more possible states.

12. The system of claim 9, wherein the system is further adapted to check the read data utilizing the associated ECC code by iteratively evaluating the read data and associated ECC code in an ECC check, where each iteration of the ECC check evaluates the read data with the known bad or questionable data positions in a different state of the two or more possible states.

13. A memory controller, comprising:
    a host interface; and
    a memory interface for one or more memories, wherein each of the one or more memories has a plurality of segments;
    wherein the memory controller is adapted to read data and an associated ECC code from a selected segment of a selected memory and read an associated erasure pointer of known bad or questionable data positions in the selected segment; and
    wherein the memory controller is adapted to check the read data utilizing the associated ECC code, where the read data is checked utilizing the associated ECC code and a selected state of two or more possible states of the known bad or questionable data positions from the associated erasure pointer.

14. The memory controller of claim 13, further comprising:

a data buffer coupled to the memory interface;
a host transfer circuit coupled to the data buffer and to the host interface; and
one or more ECC generator/checker circuits, where the data buffer and the one or more ECC generator/checker circuits are coupled to receive the read data and associated ECC code from the selected memory and a selected state of the two or more possible states of the known bad or questionable data positions to ECC check.

15. The memory controller of claim 13, wherein the memory controller is adapted to select a state of the known bad or questionable data positions of the selected segment, where the read data and the selected state of known bad or questionable data positions evaluate as uncorrupted data utilizing the associated ECC code in an ECC check.

16. The memory controller of claim 13, wherein the memory controller is further adapted to check the read data utilizing the associated ECC code in $2^N$ parallel ECC checks, where N is a number of known bad or questionable data positions stored in the associated erasure pointer, and where each of the $2^N$ parallel ECC checks evaluates the read data with the N known bad or questionable data positions in a differing state of the two or more possible states.

17. The memory controller of claim 13, wherein the memory controller is further adapted to check the read data utilizing the associated ECC code by iteratively evaluating the read data and associated ECC code in an ECC check, where each iteration of the ECC check evaluates the read data with the known bad or questionable data positions in a different state of the two or more possible states, and where the iteration stops when a state of the two or more possible states of the known bad or questionable data positions and read data evaluate as correct in the ECC check.

18. A method of correcting data in a memory, comprising:
reading data and an associated ECC code from a selected memory segment of a memory;
reading a record of known bad or questionable data positions in the selected memory segment; and
checking the read data utilizing the associated ECC code, where the read data is checked utilizing the associated ECC code and a selected data state of two or more possible data states of the known bad or questionable data positions.

19. The method of claim 18, wherein checking the read data utilizing the associated ECC code, where the read data is checked utilizing the associated ECC code and a selected data state of the two or more possible data states of the known bad or questionable data positions further comprises:

error checking the read data segment by evaluating the read data segment in one or more ECC checks for one or more states of the two or more possible data states of the known bad or questionable data positions;
selecting a correct state of the two or more possible data states of the known bad or questionable data positions where the state correctly evaluates in an ECC check with the read data and associated ECC codes; and
correcting the read data to correspond to the correct state of the known bad or questionable data positions.

20. The method of claim 18, further comprising selecting a state of the known bad or questionable data positions when the read data and the selected state of known bad or questionable data positions evaluate as uncorrupted data utilizing the associated ECC code.

21. The method of claim 18, further comprising checking the read data utilizing the associated ECC code in $2^N$ parallel ECC checks, where N is a number of known bad or questionable data positions stored in the associated erasure pointer, and where each of the $2^N$ parallel ECC checks evaluates the read data with the N known bad or questionable data positions in a differing state of the known bad or questionable data positions.

22. The method of claim 18, further comprising checking the read data utilizing the associated ECC code by iteratively evaluating the read data and associated ECC code in an ECC check, where each iteration of the ECC check evaluates the read data with the known bad or questionable data positions in a different state of the known bad or questionable data positions.

23. A method of evaluating data, comprising:
checking data utilizing an associated ECC code in an ECC check with one or more known bad or questionable data positions of the data in a selected state of two or more possible states of the one or more known bad or questionable data positions, wherein the known bad or questionable data positions of the data are stored in an erasure pointer data record.

24. The method of claim 23, further comprising:
checking the data utilizing the associated ECC code in combination with one or more known bad or questionable data positions in a second selected state of the two or more possible states.

25. The method of claim 23, further comprising:
correcting the data by modifying the data to correspond to a correctly evaluating state of the one or more known bad or questionable data positions.

* * * * *